(12) United States Patent  
Takeda et al.

(10) Patent No.: US 6,707,287 B2
(45) Date of Patent: Mar. 16, 2004

(54) ELECTRICAL QUANTITY SENSOR

(75) Inventors: Isoshi Takeda, Osaka (JP); Sukoya Tawaratsumida, Osaka (JP); Mamoru Tateno, Osaka (JP)

(73) Assignee: Matsushita Electric Works, Ltd., Kadoma (JP)

( * ) Notice: Subject to any disclaimer, the term of this patent is extended or adjusted under 35 U.S.C. 154(b) by 0 days.

(21) Appl. No.: 10/129,123

(22) PCT Filed: Dec. 25, 2001

(86) PCT No.: PCT/JP01/11383

§ 371 (c)(1),
(2), (4) Date: Jun. 27, 2002

(87) PCT Pub. No.: WO02/052284

PCT Pub. Date: Jul. 4, 2002

(65) Prior Publication Data

US 2003/0076086 A1 Apr. 24, 2003

(30) Foreign Application Priority Data

Dec. 25, 2000   (JP) ........................................ 2000-393696

(51) Int. Cl.[7] .............................................. G01R 33/00

(52) U.S. Cl. .................................. 324/127; 324/117 R

(58) Field of Search ................................ 324/126–127, 324/117 R, 117 H, 130; 323/278, 345; 361/44, 76; 363/21.01, 21.1, 40

(56) References Cited

U.S. PATENT DOCUMENTS 5,757,628 A * 5/1998 Kamata ..................... 363/40
6,434,025 B2 * 8/2002 Shirai et al. .............. 363/21.1
6,495,932 B1 * 12/2002 Yoshimizu et al. .......... 307/150

FOREIGN PATENT DOCUMENTS

| EP | 0 845 678 | 6/1998 |
| JP | 7-110347 | 4/1995 |
| WO | 93 23915 | 11/1993 |

\* cited by examiner

*Primary Examiner*—Kamand Cuneo
*Assistant Examiner*—Minh N. Tang
(74) *Attorney, Agent, or Firm*—Oblon, Spivak, McClelland, Maier & Neustadt, P.C.

(57) ABSTRACT

An electrical quantity sensor includes, an oscillation circuit for producing a clock signal of predetermined frequency, a light-emitting element which blinks at a predetermined frequency in accordance with the clock signal output from the oscillation circuit, a switching element which is optically coupled to the light-emitting element and is brought into conduction when the light-emitting element illuminates, a transformer whose primary winding is connected, by way of the switching element, to input terminals which receive a d.c. electrical signal and a synchronization detecting circuit which synchronously detects an a.c. electric signal developing in a secondary winding of the transformer while the clock signal is taken as a reference, thereby producing a d.c. voltage signal corresponding to the amplitude of the d.c. electric signal.

4 Claims, 4 Drawing Sheets

ELECTRICAL QUANTITY SENSOR

TECHNICAL FIELD

The present invention relates to an electrical quantity sensor.

BACKGROUND ART

An electric current sensor using a hall element such as that shown in FIG. 4 has hitherto been provided as an electrical quantity sensor of this type. When an electric current to be detected flows into a current path 20 passing through a core 11, a magnetic flux corresponding to the value of the electric current develops in the core 11. A hall element 12 produces a voltage corresponding to the magnetic flux. The voltage output from the hall element 12 is amplified by an amplifier 13, and the thus-amplified voltage is output to the outside.

The electric current sensor set forth detects the value of a current flowing through the current path 20 on the basis of a magnetic flux developing in the core 11 in accordance with the electric current flowing through the path 20. If a heavy current flows into the current path 20 to make the magnetic flux developing in the core 11 saturated, the current flowing through the current path 20 cannot be detected accurately.

As shown in FIG. 5, there has been proposed a current sensor based on the above-described current sensor. The sensor is provided with a current amplification circuit 14 which further amplifies the output from the amplifier 13 and outputs the thus-amplified output as a current signal. The electric current is output from the current amplification circuit 14 via a compensating winding 15 coiled around the core 11. Here, the compensating winding 15 is coiled in the direction in which the magnetic flux developing in the core 11 is neutralized.

When the current to be detected flows through the current path 20 passing through the core 11, a magnetic flux corresponding to a current value develops in the core 11. The hall element 12 produces a voltage corresponding to the magnetic flux. The voltage output from the hall element 12 is amplified by the amplifier 13, and the thus-amplified voltage is converted into a current signal by means of the current amplification circuit 14. The current signal is output via the compensating winding 15. Since the compensating winding 15 is coiled in the direction in which the magnetic flux developing in the core 11 is neutralized, occurrence of magnetic saturation of the core 11 can be prevented, thus improving the accuracy of detection of the current sensor.

However, the measurement accuracy of the current sensor greatly depends on the performance of the hall element 12. Hence, the measurement accuracy of the current sensor is greatly affected by variations in performance of the hall element 12 or the temperature characteristic of the hall element 12. The reason for this is that the temperature characteristic of the hall element is changed by package stress exerted on a balance element.

In the latter current sensor, the magnetic flux developing in the core 11 is neutralized by the magnetic flux that appears in the compensating winding 15 as a result of the current output from the current amplification circuit 14, thereby preventing magnetic saturation of the core 11. The core 11 must be wound around the compensating winding 15, thus adding to costs. In order to cancel the magnetic flux developing in the core 11, the current output from the current amplification circuit 14 must be made large, thereby resulting in an increase in current consumption.

DISCLOSURE OF INVENTION

The present invention has been conceived in light of the foregoing problem and aims at providing a low-cost, low-current-consumption current sensor which has achieved a reduction in variations in measurement accuracy.

To achieve the object, the present invention provides an electrical quantity sensor comprising: an oscillation circuit for producing a clock signal of predetermined frequency; a light-emitting element which blinks at a predetermined frequency in accordance with the clock signal output from the oscillation circuit; a switching element which is optically coupled to the light-emitting element and is brought into conduction when the light-emitting element illuminates; a transformer whose primary winding is connected, by way of the switching element, to input terminals which receive a d.c. electric signal; and a synchronization detecting circuit which synchronously detects an a.c. electric signal developing in a secondary winding of the transformer while the clock signal is taken as a reference, thereby producing a d.c. voltage signal corresponding to the amplitude of the d.c. electric signal.

When the light-emitting element blinks at a predetermined frequency corresponding to the clock signal output from the oscillation circuit, the switching element is turned on and off in accordance with blinking action of the light-emitting element. A d.c. electric signal is converted into an a.c. electric signal by means of switching action of the switching element. The thus-converted a.c. electric signal is transmitted to the secondary side of circuitry. An a.c. electric signal developing in the secondary winding of the transformer is synchronously detected by means of a synchronization detecting circuit while a clock signal is taken as a reference. As a result, the d.c. electrical signal corresponding to the amplitude of the d.c. electric signal can be obtained. In this way, the d.c. electric signal is converted into an a.c. electric signal, and the a.c. electric signal transmitted, by way of the transformer is restored into a d.c. electric signal by means of synchronous detection. In contrast with a related-art current sensor using a hall element, there is not used a hall element having great variations. There is prevented occurrence of a situation in which performance of products varies among the products, which would otherwise be caused by the performance of a hall elements serving as one constituent component of the current sensor. Thus, variations in detection accuracy and temperature characteristic of the current sensor can be reduced. A compensating winding for preventing magnetic saturation becomes obviated, and hence an increase in costs of the electrical quantity sensor can be prevented. Moreover, a circuit under detection is electrically insulated from a detection circuit by means of a light-emitting element and a switching element, which are optically coupled together, and a transformer. Hence, the influence to be exerted on the circuit under detection can be diminished. The electrical quantity sensor according to the present invention produces a d.c. voltage signal corresponding to the amplitude of a d.c. electric signal. The circuit of the electrical quantity sensor is constituted of an oscillation circuit, a switching element, an IC such as a synchronization detecting circuit, and a light-emitting element. Hence, there can be provided an electrical quantity sensor involving low current consumption.

Preferably, the d.c. electric signal is a voltage across a detection resistor inserted into an electrical path through which an electric current to be detected flows. Thus, there can be embodied a current sensor which detects a d.c. electrical current.

Preferably, the d.c. electric signal is a d.c. voltage signal. Thus, there can be embodied a voltage sensor which detects a value of d.c. voltage.

Preferably, the switching element is a MOSFET. There can be embodied an electrical quantity sensor for detecting the electrical quantity of a circuit through which an electric current flows in both directions.

BEST MODE FOR CARRYING OUT THE INVENTION

Figure 1:
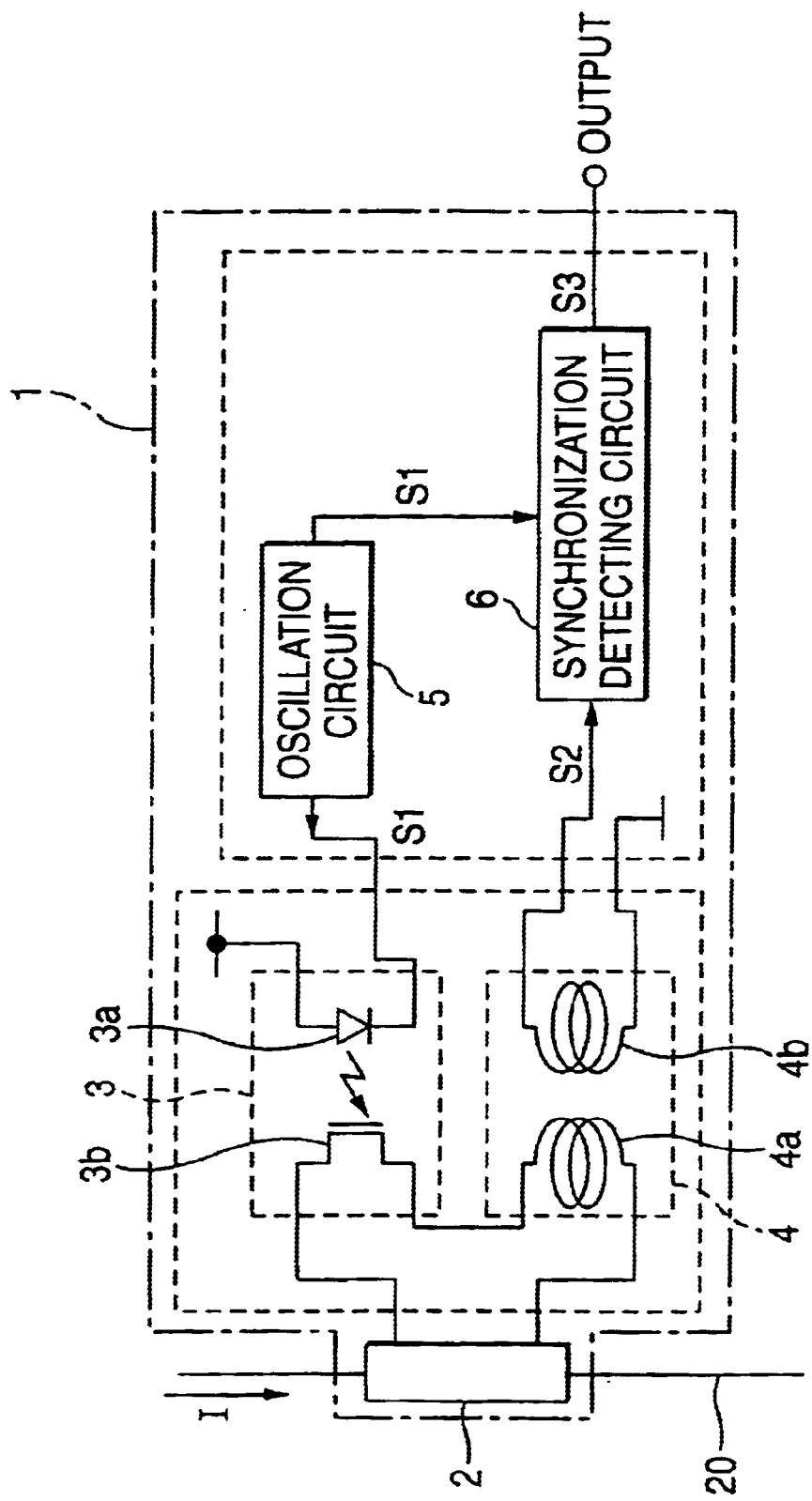
FIG. 1 is a circuit diagram of an electric current sensor according to an embodiment of the present invention.

The present invention is now described by means of taking an electrical quantity sensor according to the present invention as an example of a current sensor. FIG. 1 shows a circuit diagram of the current sensor. The current sensor 1 comprises a detection resistor 2 connected in series with a current path 20; an oscillation circuit 5 which produces a clock signal S1 of predetermined frequency; a light-emitting diode (light-emitting element) 3a whose anode receives a given applied voltage and whose cathode is connected to an output terminal of the oscillation circuit 5; a photocoupler-like light transmission element 3 constituted of a phototransistor (switching element) optically connected to the light-emitting diode 3a, and an electrically insulated phototransistor (switching element) 3b; a transformer 4 whose primary winding 4a is connected across the detection resistor 2 via the phototransistor 3b; and a synchronization detecting circuit 6 which synchronously detects a voltage signal developing in a secondary winding 4b of the transformer 4 by means of a clock signal S1 output from the oscillation circuit 5.

The operation of the current sensor 1 will now be described. The oscillation circuit 5 produces the clock signal S1 of predetermined frequency. An electric current intermittently flows into the light-emitting diode 3a of the light transmission element 3 by means of the clock signal S1, whereby the light-emitting diode 3a blinks and the phototransistor 3b is turned on/off at a predetermined frequency. When a d.c. current I to be detected flows into the current path 20, a voltage proportional to a current value of the electric current I to be detected appears across the detection resistor 2. The voltage is switched by the phototransistor 4b, and as a result an a.c. current flows into the primary winding 4a of the transformer 4. An a.c. voltage signal S2 whose peak value is proportional to the voltage across the detection resistor 2 develops in the secondary winding 4b. The synchronization detecting circuit 6 synchronously detects and demodulates the voltage signal S2 while the clock signal S1 is taken as a reference, whereby a d.c. voltage signal S3 proportional to the voltage across the detection resistor 2 is output.

As mentioned above, the current sensor 1 according to the present embodiment electrically isolates the current path 20 from the detection circuit 6 by use of the light transmission element 3 and the transformer 4. Hence, the influence to be exerted on the current path 20 can be diminished. Even when a microcurrent is measured, a current I to be detected flowing through the current path 20 can be detected accurately. The voltage across the detection resistor 2 is converted into an a.c. signal by means of being switched by the clock signal S1 of the oscillation circuit 5. The voltage signal S2 input by way of the transformer 4 is synchronously detected while the clock signal S1 is taken as a reference. Thus, the voltage signal is restored to the d.c. voltage signal S3. In contrast to a related-art current sensor using a hall element, the present current sensor does not use a hall element having great variations. Hence, the performance of the current sensor does not greatly depend on only the performance of a hall element. Thus, there can be prevented deterioration of performance or temperature characteristic of the sensor, which would otherwise be caused by variations or temperature characteristic of the hall element. In the present embodiment, the current sensor 1 outputs a d.c. voltage signal S3, and the circuit of the current sensor 1 is constituted of substantially an IC and an LED. Hence, the current sensor 1 involves low current consumption.

Figure 2:
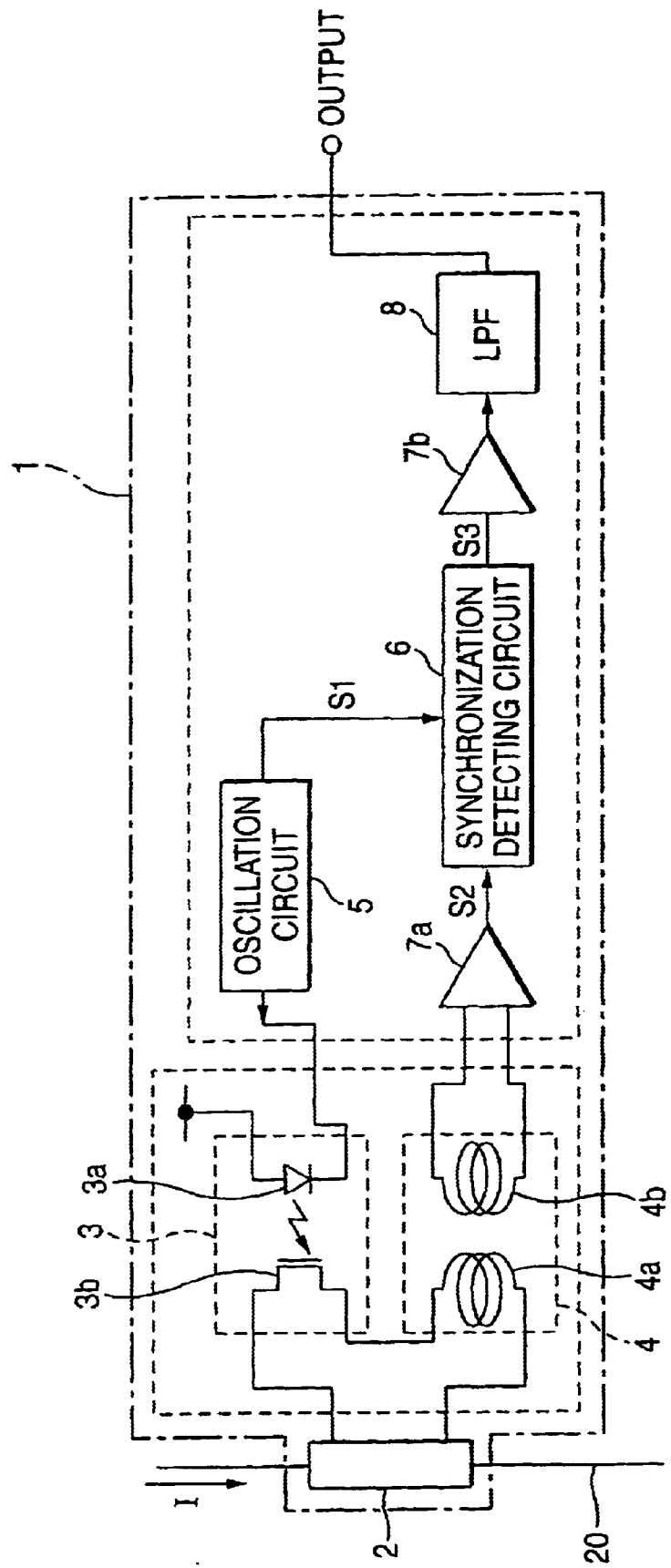
FIG. 2 is a circuit diagram of an electric current sensor according to another embodiment of the present invention.

As shown in FIG. 2, the current sensor 1 according to the present embodiment may be provided with an amplifier 7a placed before the synchronization detecting circuit 6 and an amplifier 7b placed behind the same. The magnitude of the voltage signal S3 may be adjusted by means of changing the amplifying factor of the amplifier 7a and that of the amplifier 7b. A low-pass filter (LPF) 8 is provided behind the synchronization detecting circuit 6, thereby obviating an unwanted signal component. The current sensor shown in FIG. 2 is provided with the amplifier 7a provided before the synchronization detecting circuit 6 and the amplifier 7b provided after the same; however, it may be the case that an amplifier is provided only before or only behind the synchronization detecting circuit 6.

Figure 3A:
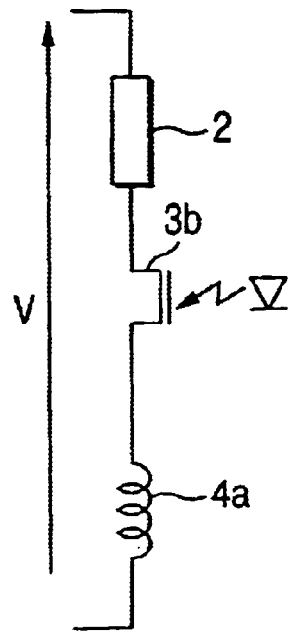
FIG. 3(a) is a substitute circuit diagram of a primary windings of the transformer of the present invention.

In the current sensor 1 according to the present embodiment, the detection resistor 2 is connected in series with the current path 20, thereby detecting the magnitude of a current which is to be detected and flows through the current path 20. As shown in FIG. 3(a), as a substitute for the provision, in the current sensor 1, of the combination consisting of the detection resistor 2, the phototransistor 3b connected across the detection resistor 2, and the primary winding 4a of the transformer 4 connected via the phototransistor 3b, there may be adopted a circuit configuration constituted by means of connecting, in series and across input terminals for a voltage to be detected, the detection resistor 2, the phototransistor 4b, and the primary winding 4a of the transformer 4. As a result, the current sensor 1 according to the embodiment can be employed as a voltage sensor for detecting a value of the voltage across the input terminals.

Figure 3B:
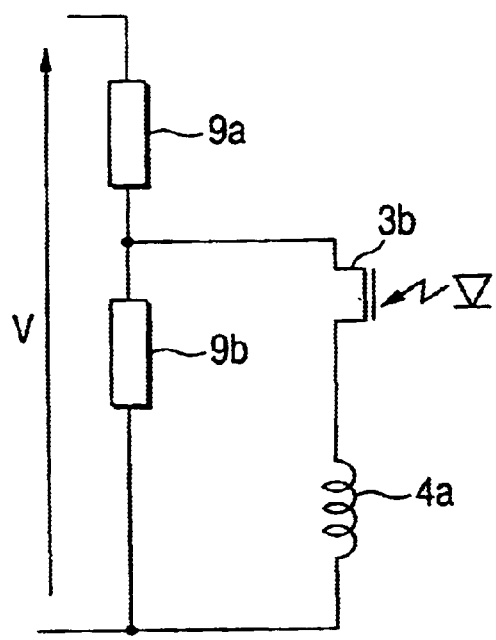
FIG. 3(b) is another substitute circuit diagram for the primary windings of the transformer of the present invention.
Figure 4:
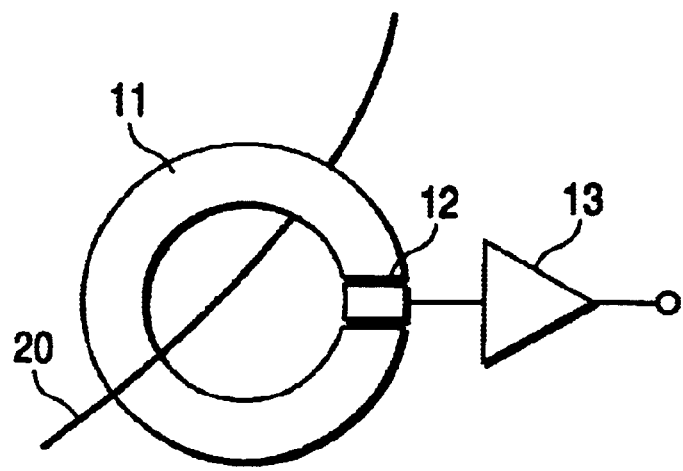
FIG. 4 is a circuit diagram of a conventional related-art electric current sensor.
Figure 5:
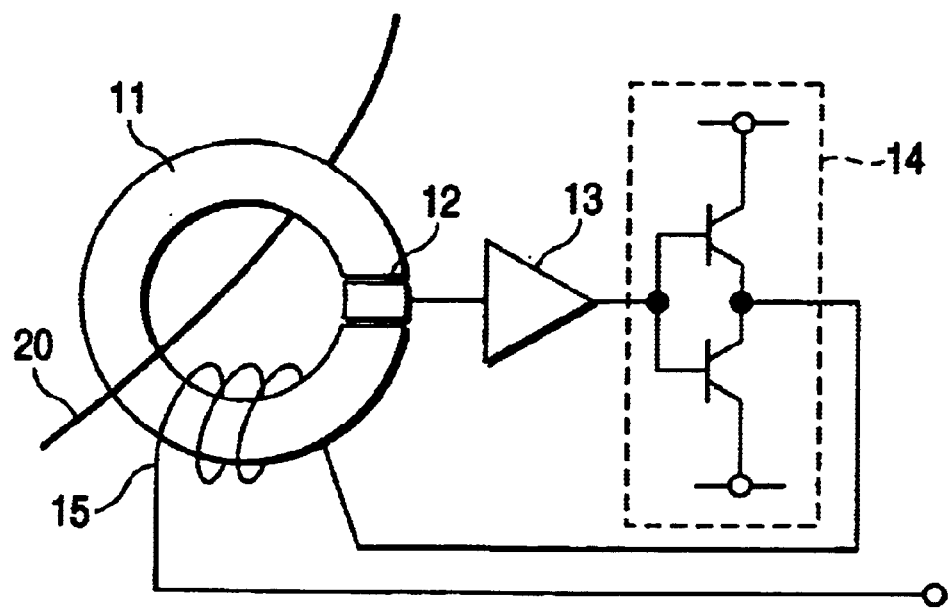
FIG. 5 is a circuit diagram of another conventional electric current sensor.

Similarly, as shown in FIG. 3(b), as a substitute for the provision, in the current sensor 1, of the combination consisting of the detection resistor 2, the phototransistor 3b connected across the detection resistor 2, and the primary winding 4a of the transformer 4 connected via the phototransistor 3b, there may be adopted a circuit configuration constituted by means of connecting, in series and across input terminals for a voltage to be detected, a resistor 9a and a resistor 9b, and connecting the resistor 9b in parallel with the phototransistor 3b connected in series with the primary winding 4a of the transformer 4. As a result, the current sensor 1 according to the embodiment can be employed as a voltage sensor for detecting a value of the voltage across the input terminals.

As shown in FIGS. 1 and 2, the current sensor 1 employs the photocoupler-like light transmission element 3 which is optically coupled to the light-emitting diode (light-emitting) element 3a, and the phototransistor (switching element) 3b which is optically connected to the light-emitting diode 3a and electrically insulated. A light transmission element such as a photo-MOS relay which is optically coupled to the light-emitting diode 4a and has an electrically-insulated MOSFET is used as a substitute for the phototransistor 3b, thereby enabling detection of the electrical quantity of a circuit in which current flows in both directions.

Furthermore, in addition to MOSFET, the present invention could equip photodiode, phototransistor, photothyristor, phototriac or the like as the switching element. In these elements, If the current could flow in both directions, it is possible to subject the current detection as same as MOSFET.

Industrial Applicability

As mentioned above, according to the first aspect of the present invention, there is provided an electrical quantity sensor comprising: an oscillation circuit for producing a clock signal of predetermined frequency; a light-emitting element which blinks at a predetermined frequency in accordance with the clock signal output from the oscillation circuit; a switching element which is optically coupled to the light-emitting element and is brought into conduction when the light-emitting element illuminates; a transformer whose primary winding is connected, by way of the switching element, to input terminals which receive a d.c. electrical signal; and a synchronization detecting circuit which synchronously detects an a.c. electric signal developing in a secondary winding of the transformer while the clock signal is taken as a reference, thereby producing a d.c. voltage signal corresponding to the amplitude of the d.c. electric signal. There is yielded that following advantages. Namely, when the light-emitting element blinks at a predetermined frequency corresponding to the clock signal output from the oscillation circuit, the switching element is turned on and off in accordance with blinking action of the light-emitting element. A d.c. electric signal is converted into an a.c. electric signal by means of switching action of the switching element. The thus-converted a.c. electric signal is transmitted to the secondary side of circuitry. An a.c. electric signal developing in the secondary winding of the transformer is synchronously detected by means of a synchronization detecting circuit while a clock signal is taken as a reference. As a result, the d.c. electric signal corresponding to the amplitude of the d.c. electric signal can be obtained. In this way, the d.c. electric signal is converted into an a.c. electric signal, and the a.c. electric signal transmitted, by way of the transformer is restored into a d.c. electric signal by means of synchronous detection. In contrast with a conventional current sensor using a hall element, there is not used a hall element having great variations. There is prevented occurrence of a situation in which performance of products varies among the products, which would otherwise be caused by the performance of a hall elements serving as one constituent component of the current sensor. Thus, variations in detection accuracy and temperature characteristic of the current sensor can be reduced. Another advantage is that a compensating winding for preventing magnetic saturation becomes obviated, and hence an increase in costs of the electrical quantity sensor can be prevented. Moreover, a circuit under detection is electrically insulated from a detection circuit by means of a light-emitting element and a switching element, which are optically coupled together, and a transformer. Hence, the influence to be exerted on the circuit under detection can be diminished. The electrical quantity sensor according to the present invention produces a d.c. voltage signal corresponding to the amplitude of a d.c. electric signal. The circuit of the electrical quantity sensor is constituted of an oscillation circuit, a switching element, an IC such as a synchronization detecting circuit, and a light-emitting element. Hence, there can be provided an electrical quantity sensor involving low current consumption.

Preferably, the d.c. electric signal is a voltage across a detection resistor inserted into an electrical path through which an electric current to be detected flows. Thus, there can be embodied a current sensor which detects a d.c. electrical current.

Preferably, the d.c. electric signal is a d.c. voltage signal. Thus, there can be embodied a voltage sensor which detects a value of d.c. voltage.

Preferably, the switching element is a MOSFET. There can be embodied an electrical quantity sensor for detecting the electrical quantity of a circuit through which an electric current flows in both directions.

What is claimed is:

1. An electrical quantity sensor comprising:

an oscillation circuit for producing a clock signal of predetermined frequency;

a light-emitting element blinking at a predetermined frequency in accordance with the clock signal output from the oscillation circuit;

a switching element optically coupled to the light-emitting element and brought into conduction when the light-emitting element illuminates;

a transformer whose primary winding is connected through the switching element to input terminals which receive a d.c. electrical signal; and a synchronization detecting circuit synchronously detecting an a.c. electric signal developing in a secondary winding of the transformer while the clock signal is obtained as a reference to produce a d.c. voltage signal corresponding to the amplitude of the d.c. electric signal.

2. The electrical quantity sensor according to claim 1, further comprising:

a detection resistor inserted into an electrical path through which an electric current to be detected flows, and the d.c. electric signal corresponding to a voltage across the detection resistor.

3. The electrical quantity sensor according to claim 1, wherein the d.c. electric signal is a d.c. voltage signal.

4. The electrical quantity sensor according to claim 1, wherein the switching element is a MOSFET.

* * * * *